(12) United States Patent
Mueller-Meskamp et al.

(10) Patent No.: US 10,109,387 B2
(45) Date of Patent: Oct. 23, 2018

(54) TRANSPARENT NANOWIRE ELECTRODE COMPRISING A FUNCTIONAL ORGANIC LAYER

(71) Applicants: Fraunhofer-Gesellschaft zur Foerderung der angewandten Forschung e.V., Munich (DE); Technische Universitaet Dresden, Dresden (DE)

(72) Inventors: Lars Mueller-Meskamp, Dresden (DE); Franz Selzer, Dresden (DE); Jan Ludwig Bormann, Dresden (DE); Nelli Weiss, Dresden (DE); Christoph Sachse, Dresden (DE); Nikolai Gaponik, Dresden (DE); Alexander Eychmueller, Dresden (DE)

(73) Assignees: Fraunhofer-Gesellschaft zur Foerderung der angewandten Forschung e.V., Munich (DE); Technische Universitaet Dresden, Dresden (DE)

( * ) Notice: Subject to any disclaimer, the term of this patent is extended or adjusted under 35 U.S.C. 154(b) by 0 days.

(21) Appl. No.: 15/186,087

(22) Filed: Jun. 17, 2016

(65) Prior Publication Data
US 2016/0300637 A1    Oct. 13, 2016

Related U.S. Application Data

(63) Continuation of application No. PCT/EP2013/077358, filed on Dec. 19, 2013.

(51) Int. Cl.
*H01B 1/02* (2006.01)
*H01B 1/22* (2006.01)
(Continued)

(52) U.S. Cl.
CPC ............. *H01B 1/22* (2013.01); *H01B 1/02* (2013.01); *H01L 31/022491* (2013.01);
(Continued)

(58) Field of Classification Search
CPC ........... H05K 1/00; H01L 23/52; H01L 31/02; H01L 31/18; H01L 31/224; H01L 51/50;
(Continued)

(56) References Cited

U.S. PATENT DOCUMENTS 4,072,536 A * 2/1978 Otsuki ............... C09D 191/005
106/237
4,220,752 A * 9/1980 Sassano ............. C08G 63/6854
524/591

(Continued)

FOREIGN PATENT DOCUMENTS

JP    2003077340 A    3/2003
JP    2008283100 A    11/2008
(Continued)

OTHER PUBLICATIONS

Choi, Dong Y. et al., "Annealing-free, flexible silver nanowire-polymer composite electrodes via a continuous two-step spray coating method", The Royal Society of Chemistry 2013, Nov. 29, 2012, pp. 977-983.
(Continued)

*Primary Examiner* — Xiaoliang Chen
(74) *Attorney, Agent, or Firm* — Perkins Coie LLP; Michael A. Glenn (57) ABSTRACT

What is presented here is a transparent electrode having: at least one carrier layer for stabilizing the electrode; at least one electrically conductive layer containing metal nanowires, which is produced by spreading a suspension of a liquid and the metal nanowires surrounded by a stabilizing layer, along the carrier layer and drying same by removing
(Continued)

the liquid; and at least one functional organic layer formed along the carrier layer, which, while the electrically conductive layer dries, by an electrical interaction with the metal nanowires and/or with the stabilizing layers of the metal nanowires, changes an interaction between the metal nanowires and the stabilizing layers such that the result is a substance-to-substance bond between the metal nanowires.

10 Claims, 7 Drawing Sheets

(51) Int. Cl.
 *H01L 31/0224* (2006.01)
 *H01L 31/18* (2006.01)
 *H01L 51/00* (2006.01)
 H01L 33/42 (2010.01)
 H01L 51/44 (2006.01)
 H01L 51/52 (2006.01)

(52) U.S. Cl.
 CPC ...... *H01L 31/1884* (2013.01); *H01L 51/0021* (2013.01); *H01L 33/42* (2013.01); *H01L 51/0097* (2013.01); *H01L 51/442* (2013.01); *H01L 51/5206* (2013.01); *H01L 51/5234* (2013.01); *H01L 2251/301* (2013.01); *H01L 2251/5338* (2013.01); *H01L 2933/0016* (2013.01); *Y02E 10/50* (2013.01)

(58) Field of Classification Search
 CPC .......... H01L 51/52; H01L 51/42; H01B 1/02; H01B 1/22; G02F 1/134; G02F 1/136
 USPC .......... 174/253, 250, 256, 257; 257/40, 784; 136/252, 256, 263; 349/43, 149; 428/76, 428/209, 216, 324, 332; 427/126.1
 See application file for complete search history.

(56) References Cited

U.S. PATENT DOCUMENTS

| | | | | | |
|---|---|---|---|---|---|
| 4,427,739 | A | * | 1/1984 | Kohle | B41M 5/10 106/31.35 |
| 5,314,713 | A | * | 5/1994 | Mori | B41M 5/506 347/105 |
| 5,600,919 | A | * | 2/1997 | Kummermehr | A01G 31/001 47/57.6 |
| 6,159,602 | A | * | 12/2000 | Kadokura | C25D 13/00 204/496 |
| 8,049,333 | B2 | * | 11/2011 | Alden | B82Y 20/00 257/741 |
| 2004/0000382 | A1 | * | 1/2004 | Omura | A61L 15/62 162/125 |
| 2006/0168811 | A1 | * | 8/2006 | Ozawa | B41M 5/5218 29/890.1 |
| 2007/0074316 | A1 | * | 3/2007 | Alden | B82Y 20/00 257/784 |
| 2008/0143906 | A1 | * | 6/2008 | Allemand | B82Y 10/00 349/43 |
| 2008/0259262 | A1 | * | 10/2008 | Jones | B82Y 10/00 349/139 |
| 2009/0087625 | A1 | * | 4/2009 | Fujikawa | B81C 1/00111 428/195.1 |
| 2010/0243295 | A1 | * | 9/2010 | Allemand | B82Y 10/00 174/250 |
| 2010/0310796 | A1 | * | 12/2010 | Nishiiri | B41M 5/52 428/32.21 |
| 2011/0139253 | A1 | * | 6/2011 | Wachi | H01L 51/442 136/263 |
| 2011/0197966 | A1 | * | 8/2011 | Nojima | H01L 51/441 136/256 |
| 2012/0065703 | A1 | * | 3/2012 | Paukshto | A61L 27/446 607/50 |
| 2012/0118617 | A1 | | 5/2012 | Bories-Azeau et al. | |
| 2012/0241889 | A1 | * | 9/2012 | Takemura | H01L 51/448 257/431 |
| 2012/0256838 | A1 | * | 10/2012 | Lee | H03K 17/9643 345/168 |
| 2013/0014980 | A1 | * | 1/2013 | Takeda | H01L 51/5212 174/257 |
| 2013/0078449 | A1 | * | 3/2013 | Naito | H01B 1/02 428/324 |
| 2013/0105770 | A1 | * | 5/2013 | Pschenitzka | H01L 31/0232 257/40 |
| 2013/0115423 | A1 | * | 5/2013 | Ii | B05D 5/00 428/141 |
| 2013/0146860 | A1 | * | 6/2013 | Toyama | H01L 51/0097 257/40 |
| 2013/0236710 | A1 | * | 9/2013 | Honda | C23C 16/483 428/212 |
| 2013/0255763 | A1 | * | 10/2013 | Naito | H01L 31/022425 136/256 |
| 2013/0255764 | A1 | * | 10/2013 | Naito | H01L 31/022425 136/256 |
| 2013/0280521 | A1 | * | 10/2013 | Mori | C23C 14/0676 428/332 |
| 2013/0323478 | A1 | * | 12/2013 | Poon | H05K 1/0296 428/209 |
| 2014/0069488 | A1 | * | 3/2014 | Tanaka | G06F 3/045 136/252 |
| 2014/0322478 | A1 | * | 10/2014 | Mori | H01L 51/5246 428/76 |
| 2015/0057439 | A1 | * | 2/2015 | Felfoldi | C07K 14/535 530/395 |
| 2015/0125679 | A1 | * | 5/2015 | Ishikawa | C23C 16/402 428/216 |

FOREIGN PATENT DOCUMENTS

| | | |
|---|---|---|
| JP | 2009505358 A | 2/2009 |
| JP | 2010205532 A | 9/2010 |
| JP | 2012527071 A | 11/2012 |
| JP | 2012238579 A | 12/2012 |
| JP | 2013246975 A | 12/2013 |
| JP | 5741581 B2 | 7/2015 |
| WO | 2007022226 A2 | 2/2007 |
| WO | 2012014621 A1 | 2/2012 |
| WO | 2013056155 A2 | 4/2013 |

OTHER PUBLICATIONS

De, Sukanta et al., "Silver Nanowire Networks as Flexible, Transparent, Conducting Films: Extremely High DC to Optical Conductivity Ratios", ACS Nano 2009, Jun. 24, 2009, pp. A-H.

Hu, Liangbing et al., "Scalable Coating ad Properties of Transparent, Flexible, Silver Nanowire Electrodes", ACS Nano vol. 4 No. 5 2010, Apr. 28, 2010, pp. 2955-2963.

Kim, Han-Ki et al., "Characteristics of Flexible ITO Electrodes Grown by Continuous Facing Target Roll-to-Roll Sputtering for Flexible Organic Solar Cells", Electrochemical and Solid-State Letters 2009, Feb. 25, 2009, pp. H169-H172.

Lee, Jung-Yong et al., "Solution-Processed Metal Nanowire Mesh Transparent Electrodes", Nano Letters 2008 vol. 8, No. 2, Jan. 2008, pp. 689-692.

Sachse, Christoph et al., "Transparent, dip-coated silver nanowire electrodes for small molecule organic solar cells", Organic Electronics 2013, Nov. 2012, pp. 143-148.

\* cited by examiner

TRANSPARENT NANOWIRE ELECTRODE COMPRISING A FUNCTIONAL ORGANIC LAYER

CROSS-REFERENCE TO RELATED APPLICATION

This is a continuation of copending International Application No. PCT/EP2013/077358, filed Dec. 19, 2013, which is incorporated herein by reference in its entirety.

BACKGROUND OF THE INVENTION

The present invention generally relates to a transparent electrode for optoelectronic devices. In particular, the present invention relates to a transparent nanowire electrode for optoelectronic devices.

Producing optoelectronic devices on flexible substrates is an important field of research nowadays. Using organic materials represents an important step for realizing same. Electrodes are necessitated for external contacting, of which at least one needs to be transparent. These electrodes are to satisfy special requirements: high conductivity is necessitated, and at the same time high transparency in the visible wavelength range. These electrodes also need to exhibit constant optical and electrical characteristics when stressed (bent) mechanically. Furthermore, producing these electrodes is to be cheap and scalable on a large scale, for example transferrable to roll-to-roll methods, and use materials of sufficient availability. Flexible electrodes available at present do not succeed in fulfilling all the requirements at the same time.

The state-of-the-art material here is indium tin oxide (ITO) which exhibits a low sheet resistance RS at, at the same time, high transparency T. However, this material is brittle so that it is only suitable for being applied on flexible substrates to a limited extent. [Kim2009] presents a flexible ITO electrode which, however, comprises a low conductivity (RS~42 ohm/sq), which is reduced further when stressed mechanically.

A promising alternative to ITO for the transparent electrodes are metal nanowires made of copper (CuNW) or silver (AgNW) which are applied onto glass or film substrates as a percolation network of arbitrary orientation [Peumans2008], [Alden2007]. Electrodes having wires made of silver are also referred to as AgNW electrodes. They exhibit high conductivity and transmission, easy processing (for example spray coating processes) and very good flexibility characteristics. However, when producing these layers, a post-processing step is necessitated in order to reduce the contact resistances between the nanowires and, thus, obtain a low sheet resistance.

At present, thermal post-treatment (about 90 minutes at 210° C. or longer a period at lower temperatures) is, for example, performed in order to reduce the sheet resistance [Sachse 2013]. Post-treatment (for example heat acting on it) of the electrodes is a particularly large obstacle since this makes processing considerably more complicated. In addition, this step makes application on flexible substrates more difficult since many polymer films lose their flexibility or are destroyed at such temperatures.

In [Hu2010], Hu et al. show a flexible electrode having a low sheet resistance of 12 ohm/sq which was processed at 120° C., but low transmission (about 60% with a wavelength of 550 nm).

In [De2009], DE et al. present flexible AgNW electrodes exhibiting good optical and electrical characteristics (T=85% with no substrate, RS=13 ohm/sq), however producing thereof is complicated (transfer process of the AgNWs) and difficult to scale.

In [Choi2013a], Choi et al. show a simple 2-step spray process. An AgNW electrode is produced here by means of spray coating, which subsequently is covered with PEDOT: PSS at 60° C.—also in a spray coating method. The resulting electrode does not require additional heat to be supplied and exhibits a low sheet resistance of RS=10.74 ohm/sq with a transmission of T=84%. These good values are achieved by the fact that the nanowires, when applying the PEDOT:PSS, are deformed at the contact points such that the contact area between nanowires placed one above the other is increased. In addition, PEDOT:PSS itself is conductive so that both the nanowires and, to a small extent, the PEDOT:PSS contribute to the conductivity of the electrode. However, the big disadvantage in [Choi 2013a] is that PEDOT:PSS needs to be used as an overlayer for deforming the nanowires. Additionally, PEDOT:PSS is acidic and slowly affects the nanowires so that such electrodes exhibit a short lifetime. A further disadvantage of PEDOT:PSS is the undesired parasitic absorption entailed in this layer.

SUMMARY

According to an embodiment, a transparent electrode may have: at least one carrier layer for stabilizing the electrode; at least one electrically conductive layer containing metal nanowires, which is produced by spreading a suspension of a liquid and the metal nanowires surrounded by a stabilizing layer, along the carrier layer and drying same by removing the liquid; and at least one functional organic layer formed along the carrier layer, characterized in that the organic layer, while the electrically conductive layer dries, by an interaction with the metal nanowires and/or with the stabilizing layers of the metal nanowires, changes an interaction between the metal nanowires and the stabilizing layers such that the result is a substance-to-substance bond between the metal nanowires.

According to another embodiment, a method for producing a transparent electrode may have the steps of: providing at least one carrier layer for stabilizing the electrode; producing at least one electrically conductive layer containing metal nanowires by spreading a suspension of a liquid and the metal nanowires surrounded by a stabilizing layer, along the carrier layer and drying same by removing the liquid; and forming at least one functional organic layer along the carrier layer, characterized in that the organic layer, while the electrically conductive layer dries, by an interaction with the metal nanowires and/or with the stabilizing layers of the metal nanowires, changes an interaction between the metal nanowires and the stabilizing layers such that the result is a substance-to-substance bond between the metal nanowires.

The inventive transparent electrode includes:

at least one carrier layer for stabilizing the electrode;

at least one electrically conductive layer containing metal nanowires, which is produced by spreading a suspension of a liquid and the metal nanowires surrounded by a stabilizing layer, along the carrier layer and drying same by removing the liquid; and at least one functional organic layer formed along the carrier layer, which, while the electrically conductive layer dries, by an interaction with the metal nanowires and/or with the stabilizing layers of the metal nanowires, changes an interaction between the metal nanowires and the stabilizing layers such that the result is a substance-to-substance bond between the metal nanowires.

The carrier layer, also referred to as substrate, is particularly provided to stabilize the transparent electrode mechanically. It may be produced in particular as a first layer of the layers of the transparent electrode and, thus, form a basis for producing further layers. The carrier layer may be implemented to be dimensionally stable or, advantageously, flexible. Dimensionally stable carrier layers may particularly consist of glass. Flexible carrier layers in contrast advantageously consist of polymers. The carrier layer, in turn, may be covered with functional layers, such as, for example, gas barriers and planarization layers.

Metal nanowires are conductive wires comprising an extension in the transverse direction in the nanometer range. The electrically conductive layer containing the metal nanowires is produced by spreading a suspension of a liquid and the metal nanowires surrounded by a stabilizing layer, along the carrier layer and solidifying same by removing the liquid. The stabilizing layer here may consist of ligands which cannot be removed completely or stabilizers necessitated for producing the metal nanowires. This stabilizing layer may, for example, include polyvinyl pyrrolidone (PVP). By mixing the metal nanowires with a suitable liquid, for example ethanol or isopropanol to form a suspension, the electrically conductive layer may easily be formed by spreading the suspension over an area along the carrier layer, the result being an even distribution of the metal nanowires in the form of a percolation network of arbitrary orientation or specific orientation in the electrically conductive layer. The suspension of the electrically conductive layer may then be dried by removing the liquid, for example by evaporation and/or vaporizing. Due to the flexibility of the metal nanowires, such an electrically conductive layer is highly flexible.

The at least one functional organic layer formed along the carrier layer consists of an organic material which, while the electrically conductive layer solidifies, exhibits a strong interaction with the metal nanowires and/or with the stabilizing layers of the metal nanowires. These may be Van-der-Waals forces and/or other electrostatic interactions and/or capillary forces. A suitably chosen organic material here may change an interaction between the metal nanowires and the stabilizing layers such that the metal nanowires which before were sealed fixedly in their respective stabilizing layer contact one another directly. This results in a substance-to-substance bond between the metal nanowires which may, for example, be caused by surface diffusion between the metal nanowires.

A substance-to-substance bond here means such a connection in which the connection partners are kept together at least partly by atomic or molecular forces. At the same time, these are non-detachable connections which may be separated only by destroying the connection means. A frictional connection and/or a positive connection may be superimposed on the substance-to-substance bond.

Additionally, it has shown that the metal nanowires may be destabilized in their shape by the interactions mentioned above such that the metal nanowires curve and thus cling to one another. This, in turn, may increase the area where the metal nanowires are positively connected to one another.

Both effects may be accompanied by an enhanced interaction between the carrier layer and the metal nanowires, caused by the functional organic layer, this causing the metal nanowires to be pulled towards the surface of the carrier layer more strongly during the drying process. This causes the metal nanowires to be positioned flatter on the surface of the carrier layer. In addition, the forces acting on the junctions increase. This, in turn, in combination with the weak structural destabilization of the nanowires, results in an improvement in the contact geometry and favors a substance-to-substance bond of the metal nanowires in the contact point.

Due to the substance-to-substance bonds and the enlarged contact points between different metal nanowires, the electrically conductive layer exhibits a low sheet resistance. Since the density of the metal nanowires does not have to be increased here, the transparency of the electrically conductive layer is not restricted. In addition, the substance-to-substance bonds contribute to the lifetime of the nanowire electrode, in particular when using a flexible carrier layer. High process temperatures, as is described, for example, in [Sachse2013], are not required for producing substance-to-substance bonds.

Since the metal nanowires are very thin, the flexibility of the electrically conductive layer is maintained largely, even when the metal nanowires are substance-to-substance bonded among one another.

The invention simplifies producing transparent, highly conductive, long-life and flexible nanowire electrodes. Reducing the maximum process temperature and/or the duration of heat exposure allows using cheap transparent carrier layers made from less temperature-resistant materials, like polyethylene terephthalate (PET), polyethylene naphthalate (PEN) and/or polycarbonate (PC), and additionally reduces the costs of producing the nanowire electrode.

Another advantage is that the suspension may be varied in its chemical composition (for example, nanowires, solvents, stabilizers) and be supplemented by further constituents, wherein post-treatment steps for increasing the conductivity need not be taken into consideration.

The invention provides a way of producing transparent and flexible electrodes which outperform current technologies in the criteria mentioned above.

In accordance with an advantageous further development of the invention, the organic layer has the effect of a solvent relative to a material of the stabilizing layer. In this way, the interaction between the metal nanowires and the stabilizing layers may be reduced such that the stabilizing layers are weakened to an extent that the metal nanowires contact one another directly and thus form a substance-to-substance bond.

In accordance with an advantageous further development of the invention, the organic layer consists largely of electrically non-conducting components. It has shown that, with an organic layer made of largely non-conducting components, the interactions between the functional organic layer and the metal nanowires and/or the stabilizing layers thereof are stronger than in cases where the organic layer consists largely of conductive components. This may be attributed to the fact that, with electrically non-conducting components, electrical charge balancing is possible only to a limited extent. In this case, the organic layer consists of largely electrically non-conducting components when the mass-related portion of the electrically non-conducting components in the entire organic layer is at least 50%.

In accordance with an advantageous further development of the invention, the mass-related portion of the non-conducting components in the organic layer is at least 80%, advantageously at least 90%, and particularly advantageously at least 95%. With the minimum values for the mass-related portions of the non-conducting components in the organic layer as indicated, a particularly low sheet resistance of the transparent electrode may be achieved.

In accordance with an advantageous further development of the invention, the electrical conductivity of the organic layer is at most 0.5 S/cm, advantageously at most 0.1 S/cm, and particularly advantageously at most 0.05 S/cm. With the maximum values for the electrical conductivity of the organic layer as indicated, sufficiently strong electrostatic interactions result between the functional organic layer and the metal nanowires and/or the stabilizing layers of the metal nanowires so as to weaken the stabilizing layers to an extent such that the metal nanowires form substance-to-substance bonds.

In accordance with an advantageous further development of the invention, the organic layer exhibits a pH value of at least 3, advantageously at least 3.5, and particularly advantageously at least 4. With the minimum pH values as indicated, it is ensured that the organic layer is not such acidic that the components of the transparent electrode, in particular the carrier layer and the metal nanowires, are decomposed chemically over time.

In accordance with a practical further development of the invention, the carrier layer is a flexible film. A flexible film here means a two-dimensional element which comprises a very small height and is bendable without considerable forces acting on it. Using a flexible film for the carrier layer makes producing transparent electrodes over large areas easier, in particular when using a roll-to-roll method. Suitable materials for such flexible films are, for example, polyethylene terephthalate (PET), polyethylene naphthalate (PEN) and/or polycarbonate (PC). However, other polymers or even metals are also possible.

In accordance with a practical further development of the invention, the metal nanowires include silver nanowires, copper nanowires, metal nanowires made of alloys of different metals and/or core-shell metal nanowires. Silver nanowires, as do copper nanowires, exhibit a low specific resistance and are easy and cheap to produce. Metal nanowires made of alloys of different metals are also conceivable. So-called core-shell metal nanowires which, in their cores, comprise a different metal than in their shells are also possible. However, it is of advantage here for all the metal nanowires to comprise the same material structure, since substance-to-substance bonds are difficult to achieve between different materials. In principle, using different material is, however, possible since the nanowires including a first material structure may form substance-to-substance bonds among one another, as do those nanowires including a second material structure.

In accordance with a further development of the invention, the organic layer is formed between the carrier layer and the electrically conductive layer. This allows performing a producing method wherein at first the carrier layer is provided, the organic layer is then formed directly or indirectly on the carrier layer and, afterwards, the electrically conductive layer is formed directly on the functional organic layer. Thus, the organic layer is advantageously formed directly on the carrier layer. However, it is also conceivable for further layers, for example, an adhesion promoting layer for increasing adhesion between the organic layer and the carrier layer, to be provided between the carrier layer and the organic layer. Usually, no further layer is provided between the organic layer and the electrically conductive layer so as to achieve a strong interaction between the organic layer and the metal nanowires or the stabilizing layers thereof. In principle, embodiments comprising several organic layers and/or several electrically conductive layers are also conceivable. Thus, in particular, alternating layer sequences of organic layers and conductive layers are possible. A first organic layer may, for example, be applied onto the carrier layer, then a first conductive layer, a second organic layer and a second conductive layer.

An advantage of the organic layer below the nanowires is that they are still exposed at the end of the process. Further processing in any way conceivable is possible here. The optical characteristics may then still be optimized independently, for example specifically changing the scattering characteristics of this layer.

In accordance with a further development of the invention, the electrically conductive layer is provided with a transparent cover layer on a side facing away from the organic layer. This reduces an evenness resulting from the nanowires and, thus, reduces problems when further processing the electrode.

In accordance with a further development of the invention, the organic layer is formed on that side of the electrical layer facing away from the carrier layer. This allows a producing method in which at first the carrier layer is provided, then the electrically conductive layer is applied directly or indirectly onto the carrier layer and, after that, the organic layer is formed on the electrically conductive layer. In such embodiments, it is of advantage for the electrically conductive layer to be applied directly onto the carrier layer. However, it is also possible to provide further layers between the carrier layer and the electrically conductive layer. An adhesion promoting layer for increasing adhesion of the conductive layer, a scattering layer for scattering light and/or a gas barrier may, for example, be provided on the carrier layer.

In accordance with a further development of the invention, the organic layer is produced by means of a rotation, spray and/or dip coating method by spreading an organic material dissolved in a solvent and solidifying same by removing the solvent. In a rotation coating method, generally a liquid material is applied onto a rotating substrate such that the liquid material, due to the centrifugal force, forms a very thin layer. In a spray coating method, generally a liquid material is sprayed onto a substrate. Furthermore, in a dip coating method, the substrate is dipped into and removed from a liquid material. Alternatively, printing methods, such as, for example, gravure printing, roll doctor coating methods or slot nozzle coating methods, may be used for producing the organic layer. In the present case, the organic material dissolved in a solvent may, depending on the embodiment be applied onto the carrier layer serving as the substrate or the conductive layer serving as the substrate, so as to produce the functional organic layer.

In accordance with an advantageous further development of the invention, removing the solvent comprises a heating step at a maximum temperature which is at most 150° C., advantageously at most 120° C., and particularly advantageously at most 100° C. With the maximum temperatures mentioned, conventional solvents may be removed by evaporation and/or vaporizing within an acceptable time such that the organic layer is dried. At the same time, with the maximum temperatures mentioned, thermal overload of the components of the transparent electrode, in particular the carrier layer, is avoided. In many cases, using temperature-sensitive carrier layers is made possible only by this. In addition, the amount of energy necessitated when producing the transparent electrode may be decreased.

In accordance with an advantageous further development of the invention, the suspension is spread by means of a rotation, spray, printing and/or dip coating method. Depending on the embodiment, the suspension may be applied onto the carrier layer serving as the substrate or the functional organic layer serving as the substrate, so as to produce the electrically conductive layer.

In accordance with an advantageous further development of the invention, the suspension is heated while being spread, wherein a maximum temperature of the suspension is at most 100° C., advantageously at most 80° C., and particularly advantageously at most 70° C. The maximum temperatures indicated ensure an even distribution of the metal nanowires. In addition, the maximum temperatures indicated promote quick solidification of the electrically conductive layer, without overloading thermally the components of the transparent electrode.

In accordance with an advantageous further development of the invention, the organic material comprises a water-soluble polymer and/or an alcohol-soluble polymer, in particular an uncharged polymer, anionic polymer and/or cationic polymer. Water-soluble and alcohol-soluble polymers form strong electrical interactions with the metal nanowires and/or with the stabilizing layers of the metal nanowires. Thus, they are easy to process and environmentally friendly. Both synthetic and natural polymers may be used here. It is possible to use uncharged polymers and charged polymers, i.e. cationic polyelectrolytes or anionic polyelectrolytes.

Suitable uncharged polymers are polyvinyl alcohol, copolymers of vinyl alcohol, polyvinyl pyrrolidone, polyacrylamide and polyisocyanate, for example.

The following cationic polyelectrolytes are, among others, suitable: chitosan, modified dextranes, for example, diethylaminoethyl-modified dextranes, hydroxymethyl cellulose trimethylamine, lysozyme, polylysine, protamine sulphate, hydroxyethyl cellulose trimethylamine and proteins with a corresponding pH value. Examples of synthetic polycations are polyallylamine, polyallylamine hydrochloride, polyamines, polyvinylbenzyltrimethylammoniumchloride, polybrene, polydiallyldimethylammoniumchloride, polyethyleneimine, polyimidazoline, polyvinylamine, polyvinylpyridine, poly(acrylamide/methacryloxypropyl-trimethylammoniumbromide), poly(diallyldimethylammoniumchloride/N-isopropylacrylamide), poly(dimethylaminoethylacrylaUacrylamide), polydimethylaminoethylmethacrylate, polydimethylaminoepichlorhydrin, polyethyleneiminoepichlorhydrin, polymethacryloxyethyltrimethylammoniumbromide, hydroxypropylmethacryl-oxyethyldimethylammoniumchloride, poly(methyldiethylaminoethylmethacrylate/acrylamide), poly(methyl/guanidine), polymethylvinylpyridiniumbromide, poly(vinylpyrrolidone-dimethylaminoethylmethacrylate) and polyvinylmethylpyridiniumbromide.

Examples of suitable natural polyanions are alginate, carboxymethylamylose, carboxymethyl cellulose, carboxy-5 methyldextran, carageenan, cellulose sulphate, chondroitin sulphate, chitosan sulphate, dextran sulphate, Arabic gum, guar gum, gellan gum, heparin, hyaluronic acid, pectin, xanthan gum and proteins with a corresponding pH value. Examples of synthetic polyanions are polyacrylates (salts of polyacrylic acid), anions of polyamino acids and copolymers thereof, polymaleate, polymethacrylate; polystyrolsulphate, polystyrolsulfonate, polyvinylphosphate, polyvinylphosphonate, polyvinylsulphate, polyacrylamidmethylpropansulfonate, polylactate, poly(butadien/maleate), poly(ethylen/maleate), poly(ethacrylaUacrylate) and poly(glycerinmethacrylate).

In accordance with an advantageous further development of the invention, the organic material comprises a tenside, in particular a non-ionic tenside, anionic tenside, cationic tenside and/or amphoteric tenside. Tensides also form strong electrical interactions with the metal nanowires and/or with the stabilizing layers of the metal nanowires. Thus, they are also easy to process and environmentally friendly. Both synthetic and natural tensides may be used here.

Suitable non-ionic tensides are fatty alcohol ethoxylates, fatty alcohol ethoxylates, alkylpolyglucosides (among others: polyethyleneglycole, polyethyleneglycolmethylether), for example.

Suitable anionic tensides are, for example, alkylbenzolsulfonate ($CnH_{2n+1}$-$C_6H_4$-$SO_3$-$Na^+$), fatty alcohol sulphates ($H_3C$—$(CH_2)_n$-$CH_2$-$O$—$SO_3$-$Na^+$[n=8-16]), alkylcarboxylate (R—COO—$Na^+$, with R=saturated or unsaturated linear alkyl residue), soaps (among others: sodium dodecylbenzol sulfonate, sodium lauryl sulfate, sodium octanoate).

Suitable cationic tensides are, among others: cetylpyridiniumchloride, cetyltrimethylammoniumbromide, tetrabutylammoniumbromide, tetrakis(decyl)ammoniumbromide.

Suitable amphoteric tensides are, for example, betaine, sultaine, taurine.

The method for producing a transparent electrode includes the steps of:
providing at least one carrier layer for stabilizing the electrode;
producing at least one electrically conductive layer containing metal nanowires by spreading a suspension of a liquid and the metal nanowires surrounded by a stabilizing layer, along the carrier layer and drying same by removing the liquid; and
forming at least one functional organic layer along the carrier layer, which, while the electrically conductive layer dries, by an interaction with the metal nanowires and/or with the stabilizing layers of the metal nanowires, changes an interaction between the metal nanowires and the stabilizing layers such that the result is a substance-to-substance bond between the metal nanowires.

This results in the advantages mentioned above.

The advantageous implementations and further developments of the invention discussed above and/or illustrated in the sub-claims may be applied individually but also in any combination thereof, except in cases of specific dependencies or incompatible alternatives, for example.

BRIEF DESCRIPTION OF THE DRAWINGS

The invention and the advantageous implementations and further developments thereof as well as their advantages will be discussed below in greater detail referring to the drawings, in which, in a schematic basic diagram each.

DETAILED DESCRIPTION OF THE INVENTION

Figure 1:
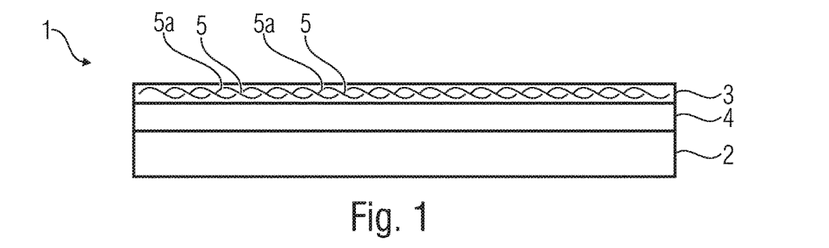
FIG. 1 shows a first embodiment of an inventive flexible and transparent electrode in a schematic side view.

FIG. 1 shows a first embodiment of an inventive flexible and transparent electrode 1 in a schematic side view. The transparent electrode 1 comprises at least one carrier layer 2 for stabilizing the electrode 1, at least one electrically conductive layer 3 containing metal nanowires 5, which is produced by spreading a suspension of a liquid and the metal nanowires 5 surrounded by a stabilizing layer 5a, along the carrier layer 2 and solidifying same by removing the liquid, and at least one functional organic layer 4 formed along the carrier layer 2, which, while the electrically conductive layer 3 solidifies, by means of an electrical interaction with the metal nanowires 5 and/or with the stabilizing layers 5a of the metal nanowires 5, changes an interaction between the metal nanowires 5 and the stabilizing layers 5a such that the result is a substance-to-substance bond between the metal nanowires 5.

In accordance with a further development of the invention, the organic layer 4 is formed between the carrier layer 2 and the electrically conductive layer 3. This allows performing a producing method in which at first the carrier layer 2 is provided, then the organic layer 4 is formed directly or indirectly on the carrier layer 2 and, after that, the electrically conductive layer 3 is formed directly on the functional organic layer 4. Thus, the organic layer 4 is formed advantageously directly on the carrier layer 2. However, it is also conceivable to provide further layers between the carrier layer 2 and the organic layer 4, for example an adhesion promoting layer for increasing adhesion between the organic layer 4 and the carrier 2. Usually, no further layer is provided between the organic layer 4 and the electrically conductive layer 3 so as to achieve a strong interaction between the organic layer 4 and the metal nanowires 5 or stabilizing layers 5a thereof.

An advantage of the organic layer 4 being present below the nanowires 5 is that these are still exposed at the end of the process. Further processing of any conceivable kind is possible here. The optical characteristics may then still be optimized independently, for example specifically changing the scattering characteristics of the layer 3.

Figure 2:
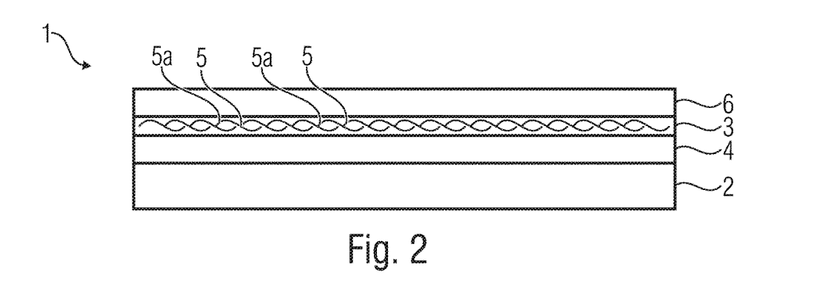
FIG. 2 shows a second embodiment of an inventive flexible and transparent electrode in a schematic side view.

FIG. 2 shows a second embodiment of an inventive flexible and transparent electrode in a schematic side view. In accordance with a further development of the invention shown here, the electrically conductive layer 3 is provided with a transparent cover layer 6 on a side facing away from the organic layer 4. This reduces unevenness resulting from the nanowires 5 and thus reduces problems when further processing the electrode.

Figure 3:
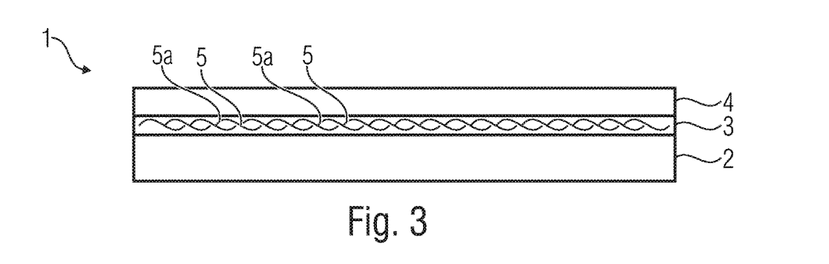
FIG. 3 shows a third embodiment of an inventive flexible and transparent electrode in a schematic side view.

FIG. 3 shows a third embodiment of an inventive flexible and transparent electrode in a schematic side view. In accordance with a further embodiment of the invention shown here, the organic layer 4 is formed on that side of the electrically conductive layer 3 facing away from the carrier layer 2. In this case, a producing method is made possible in which at first the carrier layer 2 is provided, then the electrically conductive layer 3 is applied directly or indirectly onto the carrier layer 2 and, after that, the organic layer 4 is formed on the electrically conductive layer 3. In such embodiments, it is of advantage for the electrically conductive layer 3 to be applied directly onto the carrier layer 2. However, it is also possible to provide further layers between the carrier layer 2 and the electrically conductive layer 3. An adhesion promoting layer for increasing adhesion between the conductive layer 2 and the carrier layer 2 may, for example, be provided.

Figure 4:
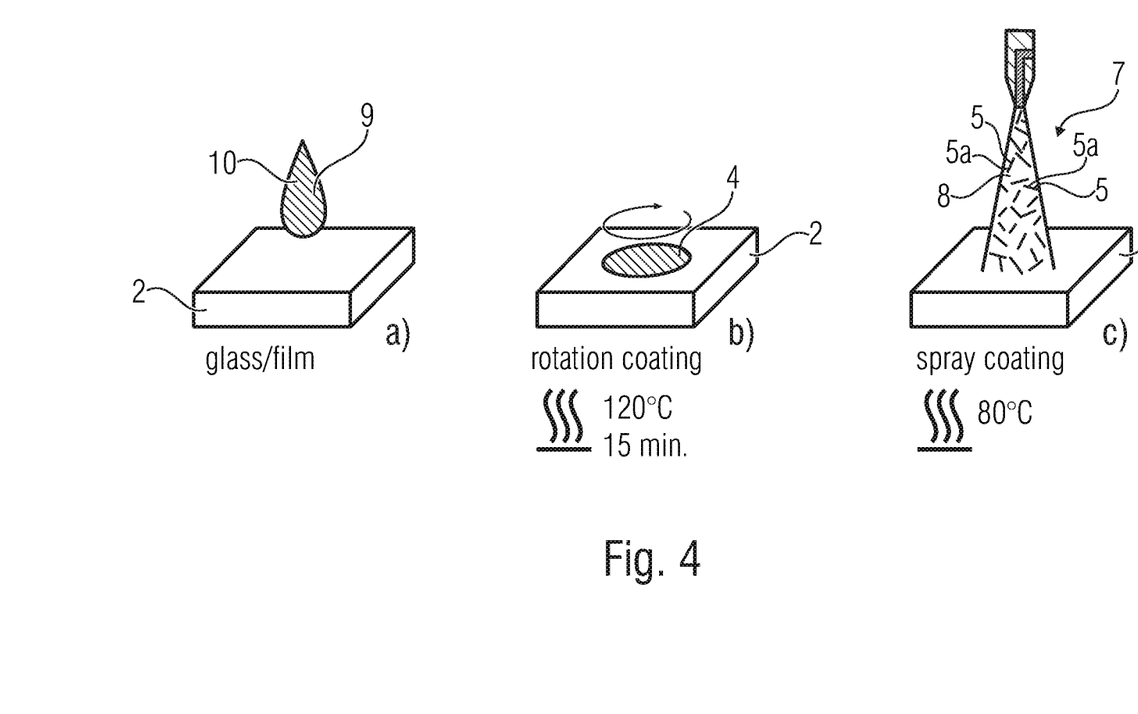
FIG. 4 shows an embodiment of an inventive method in a schematic view.

FIG. 4 shows an embodiment of an inventive method in a schematic view. The method for producing a transparent electrode 1 comprises the steps of:

providing at least one carrier layer 2 for stabilizing the electrode 1;

forming at least one functional organic layer 4 along the carrier layer 2, which, while the electrically conductive layer 3 solidifies, by an electrical interaction with the metal nanowires 5 and/or with the stabilizing layers 5a of the metal nanowires 5, changes at interaction between the metal nanowires 5 and the stabilizing layers 5a such that the result is a substance-to-substance bond between the metal nanowires 5; and producing at least one electrically conductive layer 3 containing metal nanowires 5 by spreading a suspension 7 of a liquid 8 and the metal nanowires 5 surrounded by a stabilizing layer 5a, along the carrier layer 2 and solidifying same by removing the liquid 8.

In one embodiment, producing the functionalized silver nanowire electrodes 1 may be performed as follows: A substrate 2 provided in a first step is rotation-coated with organics 4 in a second step and subsequently heated to 120° C. for 15 minutes. Subsequently, the nanowires 5 are applied in a third step by means of a spray coating method at a substrate temperature of 80° C.

The carrier layer 2 is, in particular, provided to mechanically stabilize the transparent electrode 1. It may particularly be produced as a first layer of layers 2, 3, 4, 5 of the transparent electrode 1 and, thus, form a basis for producing the further layers 3, 4, 5. The carrier layer 2 may be formed to be dimensionally stable or, advantageously, flexible. Particularly, dimensionally stable carriers may consist of glass. Flexible carrier layers 2, in contrast, advantageously consist of polymers.

Metal nanowires 5 here are conductive wires which exhibit an extension in a transverse direction in the range of nanometers. The electrically conductive layer 3 containing the metal nanowires 5 is produced in the third step by spreading a suspension 7 of a liquid 8 and the metal nanowires 5 surrounded by a stabilizing layer 5a, along the carrier layer 2 and by solidifying same by removing the liquid 8. The stabilizing layer 5a here may consist of ligands which cannot be removed completely, which are necessitated for producing the metal nanowires 5. The stabilizing layer 5a may, for example, include polyvinyl pyrrolidone (PVP). By mixing metal nanowires 5 with a suitable liquid 8, for example ethanol or isopropanol, to form a suspension 7, the electrically conductive layer 3 may be formed easily be spreading the suspension 7 over an area along the carrier layer 2, the result being an even distribution of the metal nanowires 5 in the form of an arbitrarily oriented percolation network in the electrically conductive layer 3. The suspension 7 of the electrically conductive layer 3 may then be solidified by removing the liquid 8, for example by evaporation and/or vaporizing. Due to the flexibility of the metal nanowires 5, such an electrically conductive layer 3 is very flexible.

The at least one functional organic layer 4 formed in the second step along the carrier layer consists of an organic material which, while the electrically conductive layer 3 solidifies, is in electrical interaction with the metal nanowires 5 and/or with the stabilizing layers 5a of the metal nanowires. This may be Van-der-Waals interactions and/or electrostatic interactions. Suitably choosing the organic material may thus change an interaction between the metal nanowires 5 and the stabilizing layers 5a such that the metal nanowires 5 which before were sealed fixedly in their respective stabilizing layers 5a contact one another directly. This allows a substance-to-substance bond to form between the metal nanowires 5 which may, for example, be caused by surface diffusion between the metal nanowires 5.

Due to the substance-to-substance bonds between different metal nanowires 5, the electrically conductive layer 3 comprises a low sheet resistance. Since the covering density of the metal nanowires 5 does not have to be increased here, the transparency of the electrically conductive layer 3 is not restricted. In addition, the substance-to-substance bonds contribute to the lifetime of the nanowire electrode 1, in particular when using a flexible carrier layer 2. High process temperatures, as is, for example, described in [Sachse2013], are not required for producing the substance-to-substance bonds.

Since the metal nanowires 5 are very thin, the flexibility of the electrically conductive layer is largely maintained, even when the metal nanowires 5 are substance-to-substance bonded among one another.

The invention makes producing transparent, highly conductive, long-life and flexible nanowire electrodes 1 considerable easier. Reducing the maximum process temperature and/or the duration of heat exposure allows using cheap transparent carrier layers 2 made of less temperature-resistant materials, like polyethylene terephthalate (PET), polyethylene naphthalate (PEN) and/or polycarbonate (PC), for example, and reduces the costs for producing the nanowire electrode 1 further.

A further advantage is that the suspension 7 may be varied in its chemical composition (for example nanowires 5, solvent 8, stabilizers) and be supplemented by further constituents, wherein post-treatment steps for increasing the conductivity do not have to be taken into consideration.

The invention provides a way of producing transparent and flexible electrodes 1 which may outperform current technologies in the criteria mentioned above.

In accordance with a further development of the invention, the organic layer 4 is produced by means of rotation, spray, printing and/or dip coating methods by spreading an organic material 10 dissolved in a solvent 9 and solidifying same by removing the solvent 9. In a rotation coating method, in general, a liquid material is applied onto a rotating substrate, as is indicated in FIG. 4, such that the liquid material, due to the centrifugal force, forms a very thin layer. With a spray coating method, a liquid material is generally sprayed onto a substrate. Furthermore, in a dip coating method, the substrate is dipped into a liquid material and removed from it afterwards. In the present case, the organic material 10 dissolved in a solvent 9 may, depending on the embodiment, be applied onto the carrier layer 2 serving as the substrate or the conductive layer serving as the substrate, in order to produce the functional organic layer 4.

In accordance with an advantageous further development of the invention, removing the solvent 9 comprises a heating step at a maximum temperature which is at most 150° C., advantageously at most 120° C., and particularly advantageously at most 100° C. With the maximum temperatures mentioned, conventional solvents 9 may be removed by evaporation and/or vaporizing within an acceptable period of time such that the organic layer 4 is solidified. At the same time, with the maximum temperatures mentioned, thermal overload of the components of the transparent electrode 1 is avoided. In addition, the amount of energy necessitated when producing the transparent electrode 1 may be reduced.

In accordance with an advantageous further development of the invention, the suspension is spread by means of a rotation, spray and/or dip coating method. Depending on the embodiment, the suspension may be applied onto the carrier layer serving as the substrate or the functional organic layer serving as the substrate, so as to produce the electrically conductive layer.

In accordance with an advantageous further development of the invention, the suspension is heated while spread, a maximum temperature of the suspension being at most 100° C., advantageously at most 80° C., and particularly advantageously at most 70° C. The maximum temperatures indicated ensured an even distribution of the metal nanowires. In addition, the maximum temperatures indicated promote rapid solidification of the electrically conductive layer 3 without thermally overloading the components of the transparent electrode 1.

In accordance with an advantageous further development of the invention, the organic layer 4 acts as a solvent relative to a material of the stabilizing layer 5a. In this way, the interaction between the metal nanowires 5 and the stabilizing layers 5a may be reduced such that the stabilizing layers 5a are weakened to an extent that the metal nanowires 5 get in direct contact to one another and thus form a substance-to-substance bond.

In accordance with an advantageous further development of the invention, the organic layer 4 comprises a pH value of at least 3, advantageously at least 3.5, and particularly advantageously at least 4. With the minimum pH values as indicated, it is ensured that the organic layer 4 is not such acidic that the components of the transparent electrode 1, in particular the carrier layer 2 and the metal nanowires 5 are decomposed chemically over time.

In accordance with a practical further development of the invention, the carrier layer 2 is a flexible film. A flexible film here is a two-dimensional element which comprises a very small height and is bendable with no considerable forces applied. Using a flexible film for the carrier layer 2 makes producing transparent electrodes 1 over large areas easier, in particular when using a roll-to-roll method. Suitable materials for such flexible films are polyethylene terephthalate (PET), polyethylene naphthalate (PEN) and/or polycarbonate (PC) for example. However, other polymers or even metals are also possible.

In accordance with a practical further development of the invention, the metal nanowires 5 comprise silver nanowires and/or copper nanowires. Silver nanowires, as do copper nanowires, comprise a low specific resistance and are easy and cheap to produce. However, it is of advantage for all the metal nanowires 5 to consist of a single material, since substance-to-substance bonds between different materials are difficult to achieve. However, using different material is possible in principle since then the nanowires 5 consisting of a first material may form substance-to-substance bonds among one another, as do the nanowires 5 consisting of a second material.

In accordance with an advantageous further development of the invention, the organic material 10 comprises a water-soluble polymer and/or an alcohol-soluble polymer, in particular an uncharged polymer, anionic polymer and/or cationic polymer. Water-soluble and alcohol-soluble polymers form strong electrical interactions with the metal nanowires and/or with the stabilizing layers 5a of the metal nanowires. Thus, they are easy to process and environmentally friendly. Both synthetic and natural polymers may be used here.

It is possible to use uncharged polymers and charged polymers, i.e. cationic polyelectrolytes or anionic polyelectrolytes.

Suitable uncharged polymers are polyvinyl alcohol, copolymers of vinyl alcohol, polyvinyl pyrrolidone, polyacrylamide and polyisocyanate, for example.

The following cationic polyelectrolytes are, among others, suitable: chitosan, modified dextranes, for example, diethylaminoethyl-modified dextranes, hydroxymethyl cellulose trimethylamine, lysozyme, polylysine, protamine sulphate, hydroxyethyl cellulose trimethylamine and proteins with a corresponding pH value. Examples of synthetic polycations are polyallylamine, polyallylamine hydrochloride, polyamines, polyvinylbenzyltrimethylammoniumchloride, polybrene, polydiallyldimethylammoniumchloride, polyethyleneimine, polyimidazoline, polyvinylamine, polyvinylpyridine, poly(acrylamide/methacryloxypropyl-trimethylammoniumbromide), poly(diallyldimethylammonium-chloride/N-isopropylacrylamide), poly(dimethylaminoethylacrylaUacrylamide), polydimethylaminoethylmethacrylate, polydimethylamino-epichlorhydrin, polyethyleneiminoepichlorhydrin, polymethacryloxyethyltrimethylammoniumbromide, hydroxypropylmethacryl-oxyethyldimethylammoniumchloride, poly(methyldiethylaminoethylmethacrylate/acrylamide), poly(methyl/guanidine), polymethylvinylpyridiniumbromide, poly(vinylpyrrolidone-dimethylaminoethylmethacrylate) and polyvinylmethylpyridiniumbromide.

Examples of suitable natural polyanions are alginate, carboxymethylamylose, carboxymethyl cellulose, carboxy-5 methyldextran, carageenan, cellulose sulphate, chondroitin sulphate, chitosan sulphate, dextran sulphate, Arabic gum, guar gum, gellan gum, heparin, hyaluronic acid, pectin, xanthan gum and proteins with a corresponding pH value. Examples of synthetic polyanions are polyacrylates (salts of polyacrylic acid), anions of polyamino acids and copolymers thereof, polymaleate, polymethacrylate; polystyrolsulphate, polystyrolsulfonate, polyvinylphosphate, polyvinylphosphonate, polyvinylsulphate, polyacrylamidmethylpropansulfonate, polylactate, poly(butadien/maleate), poly(ethylen/maleate), poly(ethacrylaUacrylate) and poly(glycerinmethacrylate).

In accordance with an advantageous further development of the invention, the organic material 10 comprises a tenside, in particular a non-ionic tenside, anionic tenside, cationic tenside and/or amphoteric tenside. Tensides also form strong electrical interactions with the metal nanowires and/or with the stabilizing layers 5a of the metal nanowires. Thus, they are also easy to process and environmentally friendly. Both synthetic and natural tensides may be used here.

Suitable non-ionic tensides are fatty alcohol ethoxylates, fatty alcohol ethoxylates, alkylpolyglucosides (among others: polyethyleneglycole, polyethyleneglycolmethylether), for example.

Suitable anionic tensides are, for example, alkylbenzolsulfonate ($CnH2n+1-C6H4-SO3-Na+$), fatty alcohol sulphates ($H3C-(CH2)n-CH2-O-SO3-Na+[n=8-16]$), alkyl-carboxylate (R—COO—Na+, with R=saturated or unsaturated linear alkyl residue), soaps (among others: sodium dodecylbenzol sulfonate, sodium lauryl sulfate, sodium octanoate).

Suitable cationic tensides are, among others: cetylpyridiniumchloride, cetyltrimethylammoniumbromide, tetrabutylammoniumbromide, tetrakis(decyl)ammoniumbromide.

Suitable amphoteric tensides are, for example, betaine, sultaine, taurine.

Figure 5:
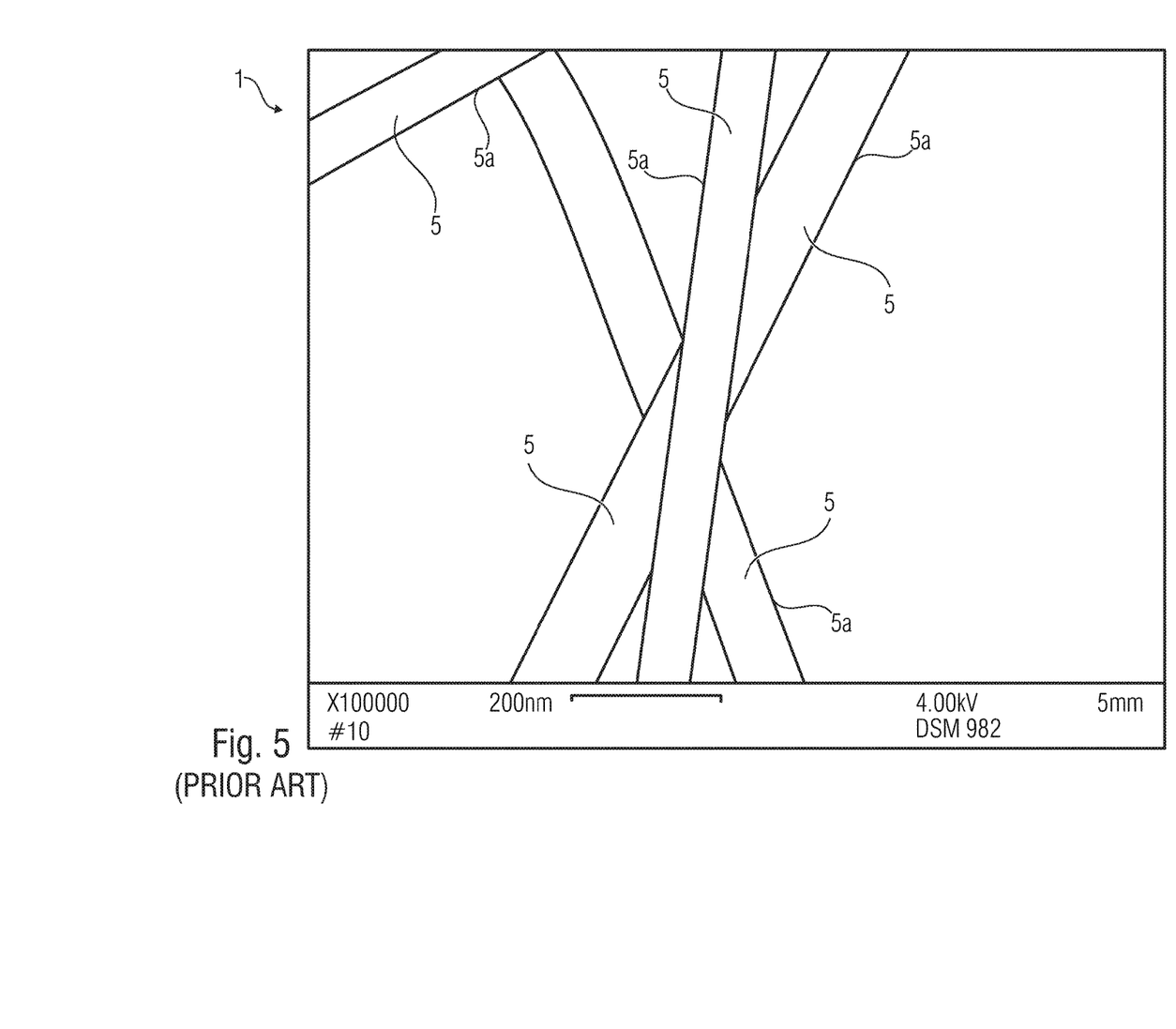
FIG. 5 shows a scanning electrode microscope picture of a transparent electrode which, in accordance with the conventional technology, is formed without a functional organic layer.

FIG. 5 shows a scanning electron microscope picture of a transparent electrode 1 which, in accordance with the conventional technology, is formed without any functional organic layer. Basically, the metal nanowires 5 may be seen here since these cause a considerably higher contrast than organic constituents of the electrode 1. It may be recognized clearly that the metal nanowires 5 lie one above the other loosely like a pile of sticks and, if at all, contact one another in points so that the metal nanowires 5 among one another exhibit a poor electrical contact. The height of two crossing metal nanowires 5 here corresponds to double the diameter of the metal nanowires 5.

Figure 6:
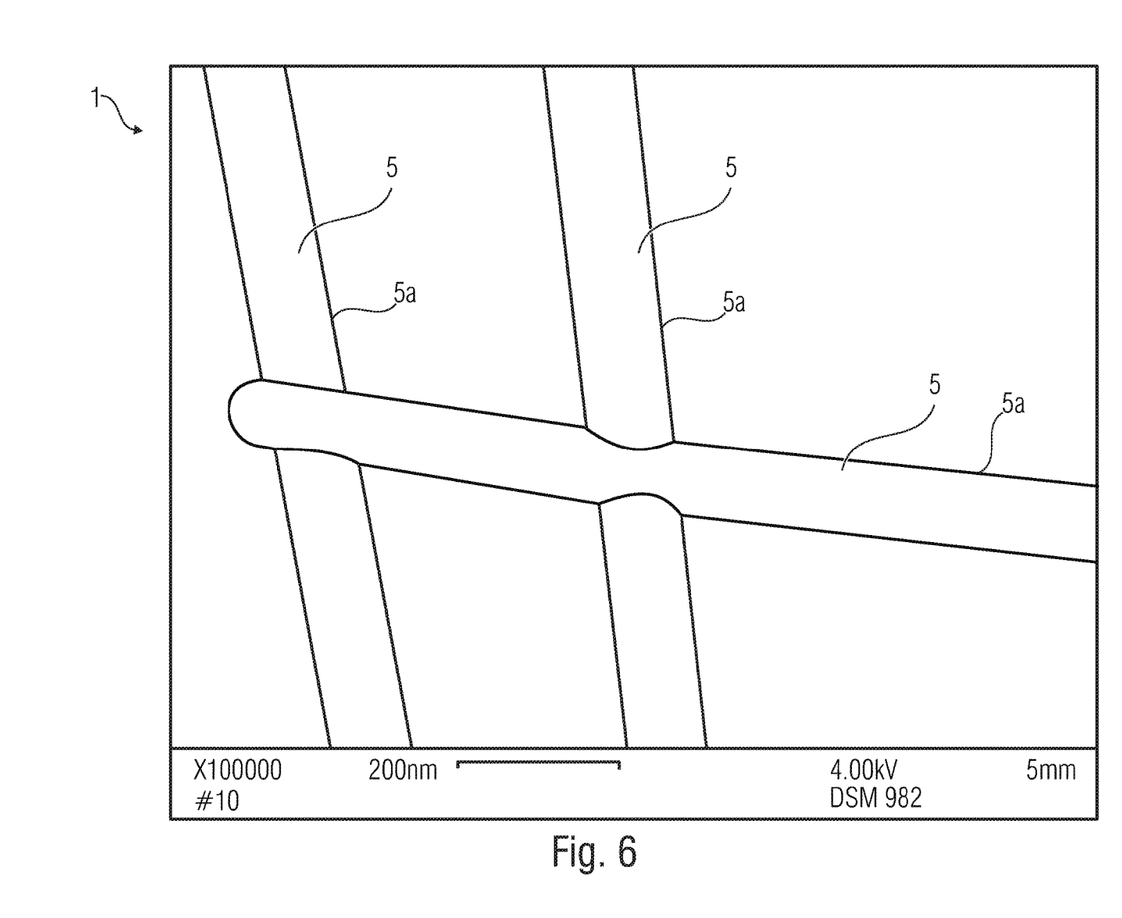
FIG. 6 shows a scanning electrode microscope picture of a transparent inventive electrode which comprises a functional organic layer between the carrier layer and the electrically conductive layer.

FIG. 6 shows a scanning electron microscope picture of a transparent inventive electrode 1 which comprises a functional organic layer 4 between the carrier layer 2 and the electrically conductive layer 3. Here, too, the metal nanowires 5 may basically be seen for the reasons mentioned above. At the cross-points of the metal nanowires 5, these are substance-to-substance bonded. Thus, at the cross-points, the material of the one metal nanowire 5 changes into the material of the other metal nanowire 5 with no clear recognizable border. For this reason, the height of two crossing metal nanowires 5 is considerably below double the diameter of the metal nanowires 5.

Figure 7:
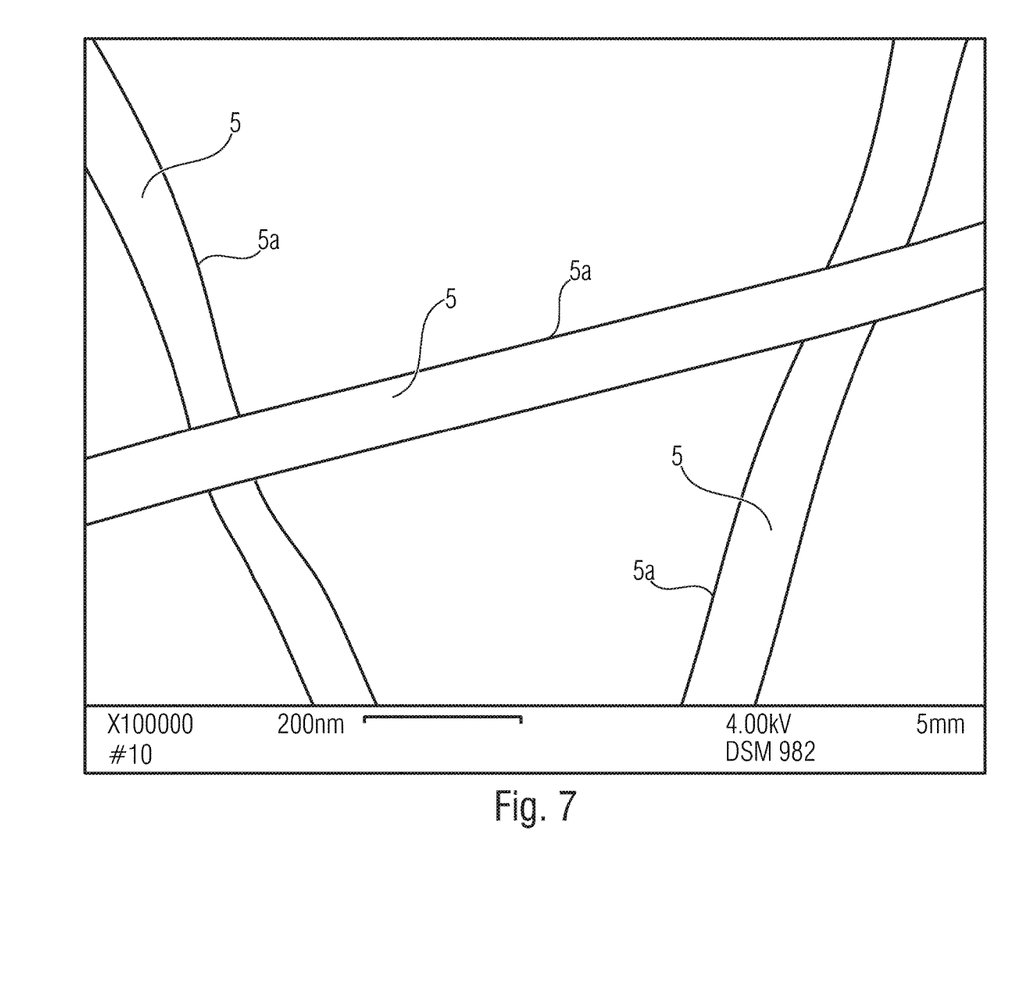
FIG. 7 shows a scanning electrode microscope picture of a transparent inventive electrode in which the electrically conductive layer is arranged between the carrier layer and the functional organic layer.

FIG. 7 shows a scanning electron microscope picture of a transparent inventive electrode in which the electrically conductive layer is arranged between the carrier layer and the functional organic layer. Here, too, at the cross-points of the metal nanowires 5, these are substance-to-substance bonded. Thus, at the cross-points, the material of the one metal nanowire 5 changes into the material of the other metal nanowire 5 with no clear recognizable border. For this reason, here, too, the height of two crossing metal nanowires 5 is considerable below double the diameter of the metal nanowires 5.

Figure 8:
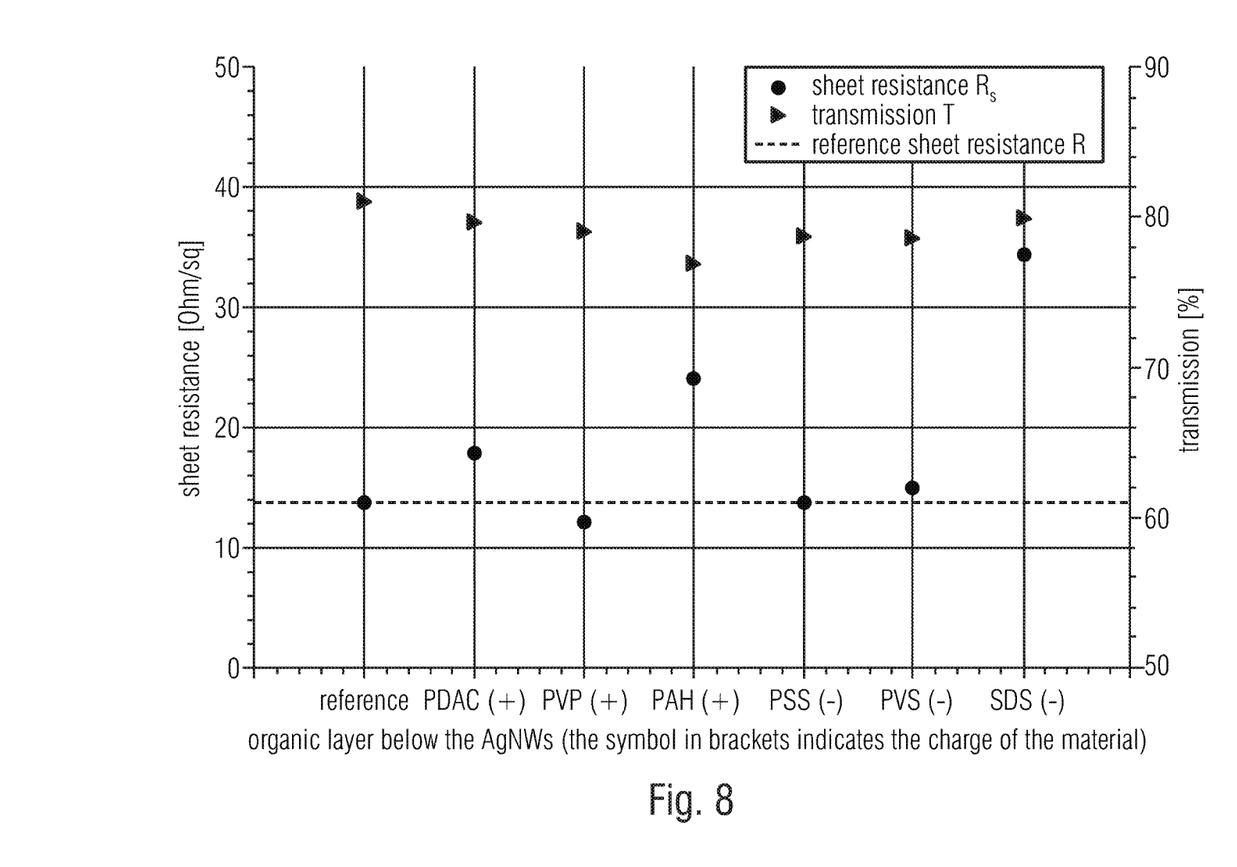
FIG. 8 shows a diagram which represents the sheet resistance and the degree of transmission of an electrode in dependence on the material of the functional organic layer.

FIG. 8 shows a diagram which represents the sheet resistance and the degree of transmission of an electrode, measured at a wavelength of 550 nm, in dependence on the material of the functional organic layer. The sheet resistance $R_s$ and the transmission coefficient T are shown for the materials PDAC, PVP, PAH, PSS, PVS and SDS. The reference measurement refers to an electrode without any functional organic layer which has been heated on a heating plate to 210° C. for 90 minutes. It is clearly recognizable that the tested materials PDAC, PVP, PAH, PSS, PVS and SDS result in similarly good sheet resistances $R_s$ and degrees of transmission T, although the highest process temperature, at 120° C., is considerably lower.

Figure 9:
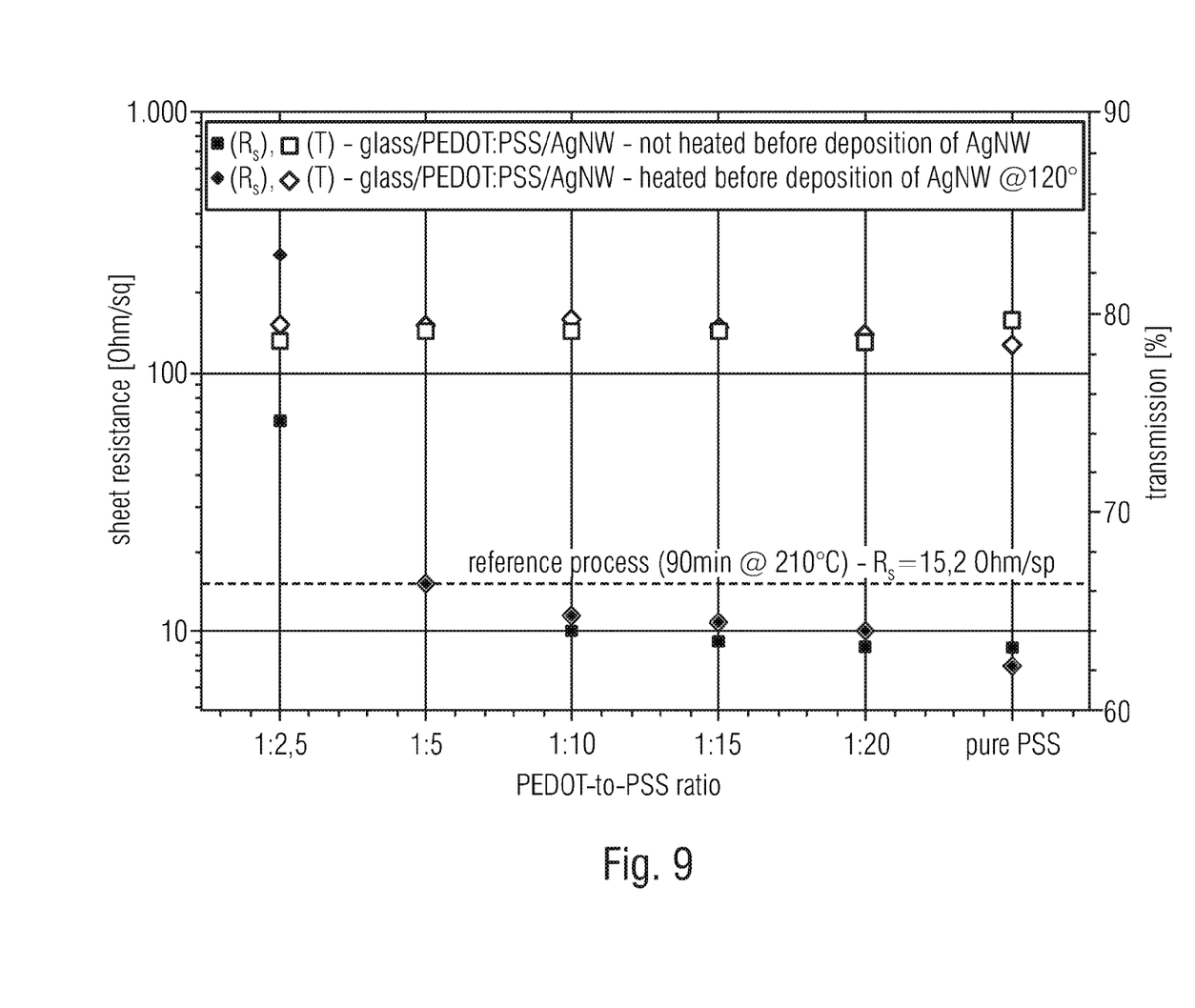
FIG. 9 shows a diagram which represents the sheet resistance and the degree of transmission of an electrode in dependence on the portion of the non-conducting component in the material of the functional organic layer.

FIG. 9 shows a diagram representing the sheet resistance $R_s$ and the degree of transmission T of an electrode 1 in dependence on the portion of non-conducting components (PSS) in the material (PEDOT:PSS) of the functional organic layer. PEDOT:PSS here is a two-phase material of the components PEDOT and PSS, wherein PEDOT is a good conductor and PSS is a non-conductor. It is clearly recognizable that the sheet resistance decreases clearly with the PSS portion, whereas the degree of transmission basically remains unchanged.

In accordance with an advantageous further development of the invention, the organic layer 4 largely consists of electrically non-conducting components. It has shown that, with an organic layer 4 made of largely non-conducting components (PSS), the sheet resistance $R_s$ of the transparent electrode 1 is lower than in cases where the organic layer 4 consists predominantly of conductive components (PEDOT). This may be attributed to the fact that particularly strong electrical interactions between the functional organic layer 4 and the metal nanowires 5 and/or the stabilizing layers 5a thereof occur with electrically non-conducting components (PSS), since an electrical charge balancing is possible only to a limited extent in electrically non-conducting components (PSS). The organic layer 4 in this case predominantly consists of electrically non-conducting components PSS, when the mass-related portion of the electrically non-conducting components in the entire organic layer 4 is at least 50%.

In accordance with an advantageous further development of the invention, the mass-related portion of the non-conducting components (PSS) in the organic layer 4 is at least 80%, advantageously at least 90%, and particularly advantageously at least 95%. With the minimum values for the mass-related portion of the non-conducting components (PSS) in the organic layer 4 indicated, a particularly low sheet resistance $R_s$ of the transparent electrode 1 may be achieved with little thermal post-treatment.

In accordance with an advantageous further development of the invention, the electrical conductivity of the organic layer 4 is at most 0.5 S/cm, advantageously at most 0.1 S/cm, and particularly advantageously at most 0.05 S/cm. With the maximum value for the electrical conductivity of the organic layer 4 indicated, sufficiently strong electrical interactions form between the functional organic layer 4 and the metal nanowires 5 and/or the stabilizing layers 5a of the metal nanowires 5 to weaken the stabilizing layers 5a to an extent such that the metal nanowires 5 may form substance-to-substance bonds.

In one embodiment, the silver nanowire electrodes 1 are treated with a functionalizing organic layer 4. This organic layer 4 may be a tenside, a polyelectrolyte or a water-soluble polymer. Possible tensides are cationic (for example hexadecyltrimethylammonium bromide (HDAB)), non-ionic (for example polyethylene glycol (PGE)) or anionic (for example sodium dodecyl sulphate (SDS)) tensides. The polyelectrolytes are either cationic (for example polydiallyldimethylammonium chloride (PDAC), polyethyleneimine (PEI), polyallylamine hydrochloride (PAH)) or anionic (for example polystyrol sulfonate (PSS), polyvinyl sulfonate (PVS)). Polyvinyl alcohol (PVA) or polyvinyl pyridine (PVP) may, for example, be used as a water-soluble polymer.

Pre-treating the substrate (glass or PET substrate) with an organic layer 4 is one possibility. After pre-cleaning the substrates, these are coated with an organic material 10 dissolved in water 9. Coating takes place optionally using the rotation, spray or dip coating method under atmospheric conditions (FIG. 4). These layers are stored on a heat plate at 120° C. for 15 minutes so as to remove remaining water and to fix the layers 4 having a height of some nanometers. Subsequently, silver nanowires 5 which are, for example, dissolved in ethanol 8 or isopropanol 8, are applied onto the pre-treated substrate 2 using a spray coating process. The substrate 2 is heated to 80° C. so as to ensure homogeneous deposition of the wires 5. Without any further processing steps, the resulting AgNW electrode 1 exhibits a low sheet resistance $R_s$ at, at the same time, high transmission T (FIG. 8).

Alternatively, the sample may also be coated with the organic material 4 after applying the silver nanowires 5. The procedure here is in analogy to the possibility just mentioned, however with subsequent rotation coating of the organic layer 4 onto the AgNW electrode 1. Here, too, the samples are placed on a 120° C. heating plate for 15 minutes in order to remove remaining water or solvent from the layer.

A reason for the large sheet resistance $R_s$ of the silver nanowires 5 is the poor electrical contact of the wires 5 among one another (FIG. 5). The first method presented here solves this problem by functionalizing the substrate surface 2 with a suitable organic layer 4. Among other things, the adhesion of the nanowires on the surface 2 is increased strongly here. A reason for this is ligands of PVP around the silver nanowire 5 which are necessitated for synthesis of the wires 5 and cannot be removed completely. They strongly interact with the organic layer 4 on the substrate surface 2. This improves the contacts of the wires 5 among one another, resulting in a considerable reduction in the sheet resistance $R_s$ of the electrode 1 (FIG. 6). The type of charge of the organic layer here is irrelevant.

A completely different mechanism becomes visible when the organic material 4 is applied onto the silver nanowire electrode 5. The layer 3 is compressed by the process of solvent evaporation. This process also influences the silver nanowires 5 which are brought closer to one another (FIG. 7). Like in the method mentioned above, the contact of the wires 5 among one another is increased, resulting in the sheet resistance to decrease.

The methods presented make producing transparent, highly conductive and flexible silver nanowire electrodes 1 considerably easier. Due to the flexibility of the silver nanowires 5, a roll-to-roll method is possible for producing transparent electrodes 1 on film substrates 2 such as, for example, PET, PEN, PC or other polymer or metal substrates, over large areas. Reducing the maximum process temperature and duration of heat exposure here further reduces the costs for implementing such producing lines.

Another advantage is separating the functionalizing intermediate layer 4 and nanowire dispersion 3 into a two-step method. This allows more freedom when processing. Thus, the nanowire dispersion 3 may be varied in its chemical composition (for example solvent, stabilizers) and be combined with other nano-particles, wherein at the same time post-treatment steps for increasing the conductivity do not have to be taken into consideration.

An advantage of the organic layer 4 below the nanowires 5 is that these are still exposed at the end of the process. Further processing of any kind is conceivable here. The optical characteristics may still be optimized independently (for example, the specific change in the scattering characteristics of this layer).

Depending on the application, it may also be useful to embed the nanowire electrode into a transparent organic layer 6. This reduces unevenness resulting from the silver nanowires and thus reduces problems when further processing the electrode 1.

Aspects of the present invention discussed in connection with an inventive device also apply to an inventive method, except in cases of obvious incompatibility, for example. Additionally, aspects of the present invention discussed in connection with an inventive method also apply to an inventive device.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

LIST OF REFERENCES

[Peumans2008] Lee, J.-Y., Connor, S. T., Cui, Y., & Peumans, P. (2008). Solution-processed metal nanowire mesh transparent electrodes. Nano letters, 8(2), 689-92. DOI: 10.1021/nl073296g

[Alden2007] ALDEN, J., DAI, H., & KNAPP, M. (2007). NANOWIRES-BASED TRANSPARENT CONDUCTORS. WO Patent. Retrieved from http://patentscope.wipo.int/search/en/WO2007022226

[Kim2009] Kim, H.-K., Jeong, J.-A., Choi, K.-H., Jeong, S.-W., & Kang, J.-W. (2009). Characteristics of Flexible ITO Electrodes Grown by Continuous Facing Target Roll-to-Roll Sputtering for Flexible Organic Solar Cells. Electrochemical and Solid-State Letters, 12(5), H169. DOI: 10.1149/1.3086260

[Sachse2013] Sachse, C., Müller-Meskamp, L., Bormann, L., Kim, Y. H., Lehnert, F., Philipp, A., Beyer, B., et al. (2013). Transparent, dip-coated silver nanowire electrodes for small molecule organic solar cells. Organic Electronics, 14(1), 143-148. DOI: 10.1016/j.orgel.2012.09.032

[Hu2010] Hu, L., Kim, H. S., Lee, J.-Y., Peumans, P., & Cui, Y. (2010). Scalable coating and properties of transparent, flexible, silver nanowire electrodes. ACS nano, 4(5), 2955-63. DOI: 10.1021/nn1005232

[De2009] De, S., Higgins, T. M., Lyons, P. E., Doherty, E. M., Nirmalraj, P. N., Blau, W. J., Boland, J. J., et al. (2009). Silver Nanowire Networks as Flexible, Transparent, Conducting Films: Extremely High DC to Optical Conductivity Ratios. ACS nano, 3(7), 1767-74. DOI: 10.1021/nn900348c

[Choi2013a] Choi, D. Y., Kang, H. W., Sung, H. J., & Kim, S. S. (2013). Annealing-free, flexible silver nanowire-polymer composite electrodes via a continuous two-step spray-coating method. Nanoscale, 5(3), 977-83. DOI: 10.1039/c2nr32221h

The invention claimed is:

1. A transparent electrode comprising:
at least one carrier layer for stabilizing the electrode;
at least one electrically conductive layer comprising metal nanowires, which is produced by spreading a suspension of a liquid and the metal nanowires, which are surrounded by stabilizing layers in such way that each of the metal nanowires is surrounded by one of the stabilizing layers, along the carrier layer and drying same by removing the liquid; and
at least one functional organic layer formed along the carrier layer,
wherein
the organic layer, while the electrically conductive layer dries, by an interaction with the metal nanowires and/or with the stabilizing layers of the metal nanowires, changes an interaction between the metal nanowires and the stabilizing layers such that the result is a substance-to-substance bond between the metal nanowires.

2. The electrode in accordance with claim 1, wherein the organic layer predominantly comprises electrically non-conducting components.

3. The electrode in accordance with claim 2, wherein the mass-related portion of the non-conducting components in the organic layer is at least 80%, advantageously at least 90%, and particularly advantageously at least 95%.

4. The electrode in accordance with claim 1, wherein the carrier layer is a flexible film.

5. The electrode in accordance with claim 1, wherein the metal nanowires comprise silver nanowires, copper nanowires, metal nanowires of alloys of different metals and/or core-shell metal nanowires.

6. The electrode in accordance with claim 1, wherein the organic layer is formed between the carrier layer and the electrically conductive layer.

7. The electrode in accordance with claim 6, wherein the electrically conductive layer is provided with a transparent cover layer on a side facing away from the organic layer.

8. The electrode in accordance with claim 1, wherein the organic layer is formed on that side of the electrically conductive layer facing away from the carrier layer.

9. The electrode in accordance with claim 1, wherein the organic material comprises a water-soluble polymer and/or an alcohol-soluble polymer, in particular an uncharged polymer, anionic polymer and/or cationic polymer.

10. The electrode in accordance with claim 1, wherein the organic material comprises a tenside, in particular a non-ionic tenside, anionic tenside, cationic tenside and/or amphoteric tenside.

* * * * *